(12) United States Patent
Kushibiki et al.

(10) Patent No.: US 8,491,805 B2
(45) Date of Patent: Jul. 23, 2013

(54) SEMICONDUCTOR DEVICE MANUFACTURING METHOD AND PLASMA ETCHING APPARATUS

(75) Inventors: Masato Kushibiki, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 100 days.

(21) Appl. No.: 13/019,602

(22) Filed: Feb. 2, 2011

(65) Prior Publication Data

US 2011/0195577 A1 Aug. 11, 2011

Related U.S. Application Data

(60) Provisional application No. 61/310,513, filed on Mar. 4, 2010.

(30) Foreign Application Priority Data

Feb. 5, 2010 (JP) ................................. 2010-024552

(51) Int. Cl.
*C03C 15/00* (2006.01)
(52) U.S. Cl.
USPC ............. 216/67; 438/689; 438/790; 438/718; 438/725

(58) Field of Classification Search
USPC ..... 216/67; 438/689, 690, 718, 725; 156/643, 156/653, 656, 657; 345.1, 345.38
See application file for complete search history.

(56) References Cited

U.S. PATENT DOCUMENTS

| 5,236,549 A * | 8/1993 | Shirakawa et al. ............ 438/695 |
| 5,595,627 A * | 1/1997 | Inazawa et al. ................ 438/715 |
| 2006/0180571 A1* | 8/2006 | Fujihara et al. .................. 216/67 |

FOREIGN PATENT DOCUMENTS

JP 4-73287 11/1992

* cited by examiner

*Primary Examiner* — Nadine Norton
*Assistant Examiner* — Maki Angadi
(74) *Attorney, Agent, or Firm* — Rothwell, Figg, Ernst & Manbeck, P.C.

(57) ABSTRACT

A semiconductor device manufacturing method includes a plasma etching step for etching an etching target film formed on a substrate accommodated in a processing chamber. In the plasma etching step, a processing gas including a gaseous mixture containing predetermined gases is supplied into the processing chamber, and a cycle including a first step in which a flow rate of at least one of the predetermined gases is set to a first value during a first time period and a second step in which the flow rate thereof is set to a second value that is different from the first value during a second time period is repeated consecutively at least three times without removing a plasma. The first time period and the second time period are set to about 1 to 15 seconds.

8 Claims, 16 Drawing Sheets

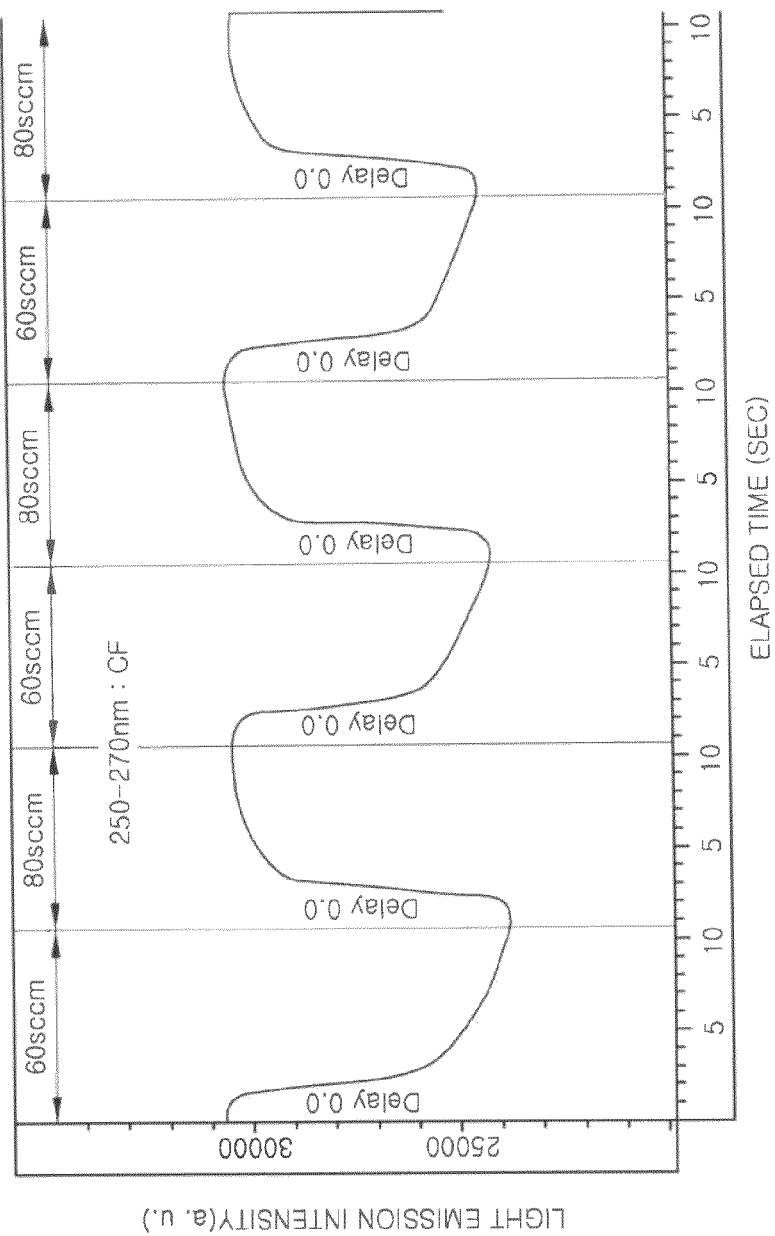

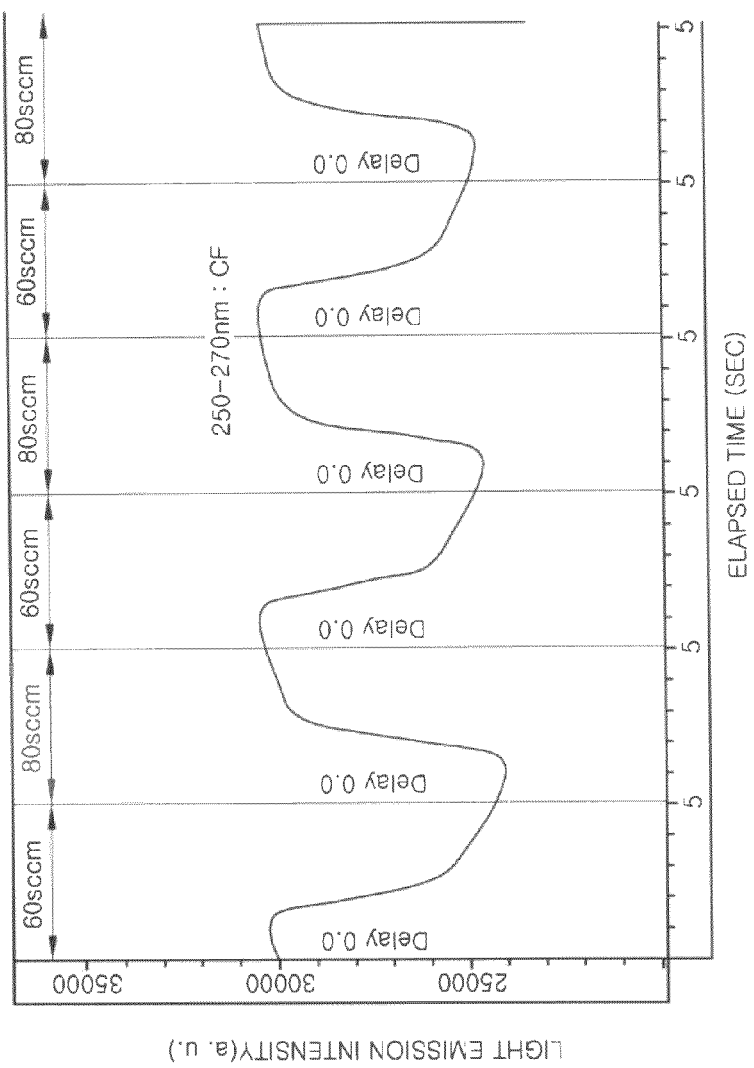

SEMICONDUCTOR DEVICE MANUFACTURING METHOD AND PLASMA ETCHING APPARATUS

CROSS-REFERENCE TO RELATED APPLICATIONS

This application claims priority to Japanese Patent Application No. 2010-024552 filed on Feb. 5, 2010 and U.S. Provisional Application No. 61/310,513 filed on Mar. 4, 2010, the entire contents of which are incorporated herein by reference.

FIELD OF THE INVENTION

The present invention relates to a semiconductor device manufacturing method and a plasma etching apparatus.

BACKGROUND OF THE INVENTION

A semiconductor device manufacturing process includes a process for plasma-etching various films formed on a substrate, e.g., a semiconductor wafer or the like, provided in a processing chamber of a plasma etching apparatus.

In the plasma etching apparatus, the interior of the processing chamber accommodating therein a substrate, e.g., a semiconductor wafer or the like, is set to a depressurized atmosphere of a predetermined pressure and a predetermined processing gas is supplied into the processing chamber. The processing gas is converted to a plasma by a RF (radio frequency) electric field or the like. By applying the plasma of the processing gas to the substrate, various films formed on the substrate are plasma-etched.

As for a plasma processing method using the above plasma etching apparatus or the like, there has been known a method for etching silicon without generating an undercut by forming a nitride film on a surface while temporarily stopping etching by intermittently stopping the supply of $SF_6$ gas in a gaseous mixture supplied into a processing chamber for a short period of time, the $SF_6$ gas serving to facilitate etching (see, e.g., Japanese Patent Application Publication No. H4-73287).

Along with the trend toward miniaturization of a circuit pattern of a semiconductor device, a pattern size has been reduced from about 56 nm to about 43 nm and further to about 32 nm. For that reason, a pattern formed by plasma etching tends to be miniaturized and become increased in height or depth. Therefore, a technique for uniformly forming such pattern with high accuracy and high selectivity has been developed. However, due to the trade-off relationship between the selectivity and the pattern shape, it is difficult to form a pattern, e.g., a thin and deep hole, a line-and-space pattern having a small width and a tall height, or the like, with high selectivity.

SUMMARY OF THE INVENTION

In view of the above, the present invention provides a semiconductor device manufacturing method and a plasma etching apparatus, capable of uniformly forming a fine pattern with high accuracy and high selectivity.

In accordance with an aspect of the present invention, there is provided a semiconductor device manufacturing method including a plasma etching step for etching an etching target film formed on a substrate accommodated in a processing chamber. In the plasma etching step, a processing gas including a gaseous mixture containing a plurality of predetermined gases is supplied into the processing chamber, and a cycle including a first step in which a flow rate of at least one of the predetermined gases is set to a first value during a first time period and a second step in which the flow rate thereof is set to a second value that is different from the first value during a second time period is repeated consecutively at least three times without extinguishing a plasma generated in the processing chamber. The first time period and the second time period are set to range from about 1 to 15 seconds. A total flow rate of the processing gas in the first step and a total flow rate of the processing gas in the second step are set to be substantially equal to each other, or a difference between the total flow rates, if there exists, is set to range within about 10% of the larger one of the total flow rates. In each of the first and the second step, a gas for facilitating etching of the etching target film is contained in the processing gas.

BRIEF DESCRIPTION OF THE DRAWINGS

The objects and features of the present invention will become apparent from the following description of embodiments, given in conjunction with the accompanying drawings, in which:

FIGS. 14A to 18 are graphs showing temporal variations in plasma emission intensities in the case of changing processes;

DETAILED DESCRIPTION OF THE EMBODIMENT

Embodiments of the present invention will now be described with reference to the accompanying drawings which form a part hereof.

Figure 1:
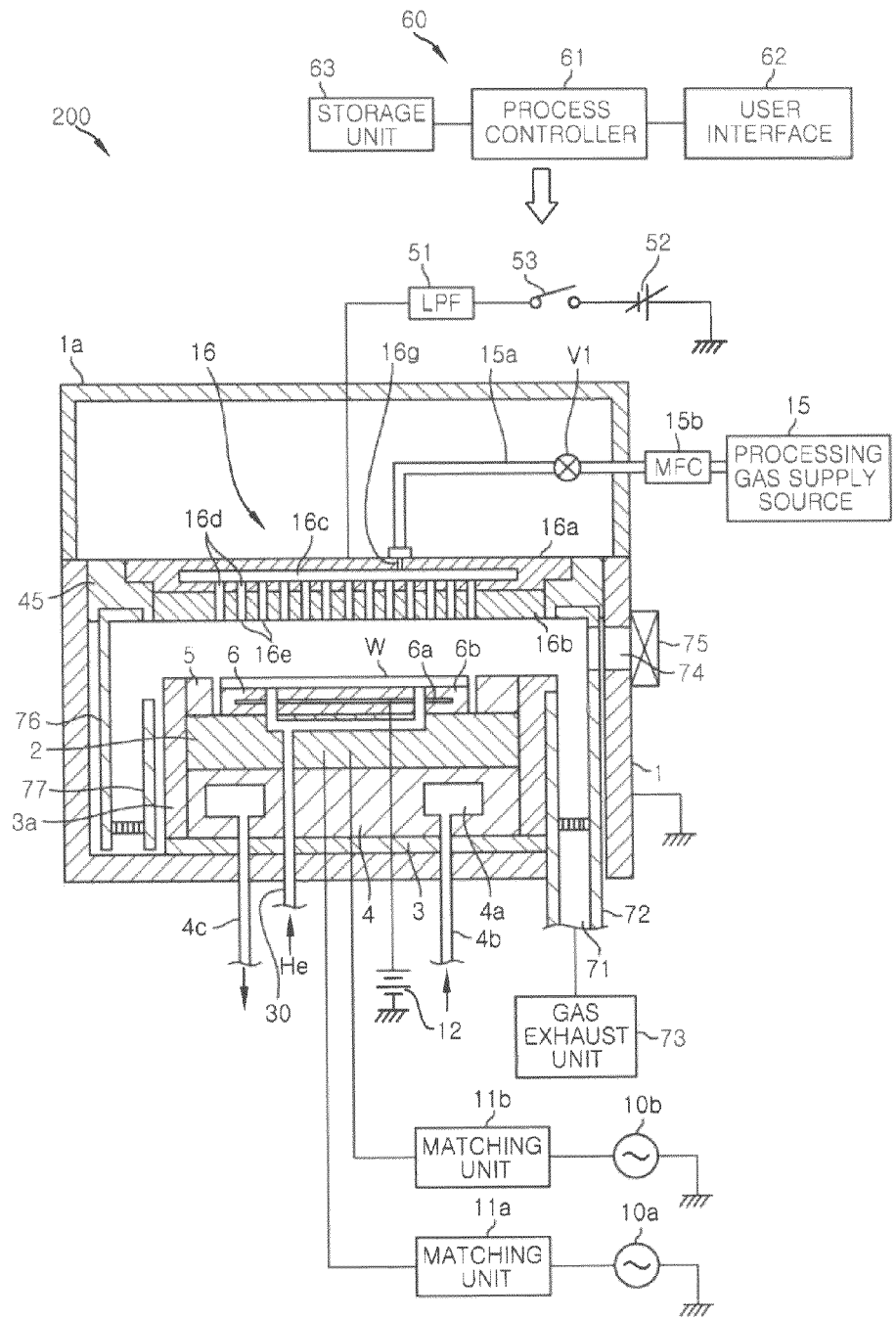
FIG. 1 schematically shows a configuration of a plasma etching apparatus in accordance with an embodiment of the present invention.

FIG. 1 schematically shows a configuration of a plasma etching apparatus 200 in accordance with an embodiment of the present invention. The plasma etching apparatus 200 includes a processing chamber 1 which is airtightly configured and electrically grounded. The processing chamber 1 has a cylindrical shape, and is made of, e.g., aluminum having an anodically oxidized surface.

Disposed in the processing chamber 1 is a mounting table 2 for supporting thereon a semiconductor wafer W as a target substrate horizontally. The mounting table 2 is made of, e.g., aluminum having an anodically oxidized surface, and serves as a lower electrode. The mounting table 2 is supported by a conductive support 4 via an insulating plate 3. Further, a focus ring 5 formed of, e.g., single-crystalline silicon, is disposed on an outer peripheral portion of a top surface of the mounting table 2. Moreover, a cylindrical inner wall member 3a made of, e.g., quartz or the like, is provided so as to surround the mounting table 2 and the support 4.

The mounting table 2 is connected to a first RF (radio frequency) power supply 10a via a first matching unit 11a and also connected to a second RF power supply 10b via a second matching unit 11b. The first RF power supply 10a serving to generate a plasma supplies, to the mounting table 2, an RF power having a predetermined frequency (higher than or equal to 27 MHz, e.g., about 40 MHz). Further, the second RF power supply 10b serving to attract (bias) ions supplies, to the mounting table 2, an RF power having a predetermined frequency (lower than or equal to 13.56 MHz, e.g., 2 MHz) lower than that of the first RF power supply 10a.

Meanwhile, a shower head 16 serving as an upper electrode is provided above the mounting table 2 so as to face the mounting table 2 in parallel. The shower head 16 and the mounting table 2 serve as a pair of electrodes (upper electrode and lower electrode).

An electrostatic chuck 6 for electrostatically attracting and holding the semiconductor wafer W is provided on the top surface of the mounting table 2. The electrostatic chuck 6 includes an insulator 6b and an electrode 6a embedded therein, and the electrode 6a is connected to a DC power supply 12. The semiconductor wafer W is attracted and held on to the electrostatic chuck 6 by a Coulomb force or the like which is generated by a DC voltage applied from the DC power supply 12 to the electrode 6a.

A coolant path 4a is formed inside the support 4 and connected to a coolant inlet line 4b and a coolant outlet line 4c. By circulating a proper coolant, e.g., cooling water or the like, through the coolant path 4a, the temperature of the support 4 and that of the mounting table 2 can be controlled to respective predetermined levels. Further, a backside gas supply line 30 for supplying a cold heat transfer gas (backside gas) such as helium gas or the like to the backside of the semiconductor wafer W is formed so as to penetrate through the mounting table 2 and the like. With such configuration, the semiconductor wafer W attracted and held on the top surface of the mounting table 2 through the electrostatic chuck 6 can be controlled at a predetermined temperature.

The shower head 16 is disposed at a ceiling portion of the processing chamber 1. The shower head 16 includes a main body 16a and an upper ceiling plate 16b serving as an electrode plate. The shower head 16 is supported at an upper portion of the processing chamber 1 by an insulating member 45. The main body 16a is made of a conductive material, e.g., aluminum having an anodically oxidized surface, and is configured to detachably hold the upper ceiling plate 16b provided under the main body 16a.

A gas diffusion space 16c is formed inside the main body 16a. A plurality of gas through holes 16d is formed at a bottom portion of the main body 16a so as to be positioned under the gas diffusion space 16c. Further, gas injection holes 16e are formed in the upper ceiling plate 16b so as to extend therethrough in its thickness direction and communicate with the gas through holes 16d. With such configuration, a processing gas supplied to the gas diffusion space 16c is dispersed and supplied in a shower shape into the processing chamber 1 through the gas through holes 16d and the gas injection holes 16e. Moreover, a line (not shown) for circulating a coolant is provided in the main body 16a and the like, so that the shower head 16 can be cooled to a desired temperature during a plasma etching process.

A gas inlet port 16g for introducing the processing gas into the gas diffusion space 16c is formed at the main body 16a. The gas inlet port 16g is connected to one end of a gas supply line 15a. The other end of the gas supply line 15a is connected to a processing gas supply source 15 for supplying a processing gas for plasma etching.

The gas supply line 15a is provided with a mass flow controller (MFC) 15b and a valve V1 sequentially from its upstream side. Further, a gas, e.g., Ar, $O_2$, $C_4F_8$, HBr, $NF_3$, $C_4F_6$, $CF_4$ or the like, serving as a processing gas for plasma etching is supplied from the processing gas supply source 15 to the gas diffusion space 16c through the gas supply line 15a. The gas is dispersed and supplied in a shower shape into the processing chamber 1 from the gas diffusion space 16c through the gas through holes 16d and the gas injection holes 16e.

A variable DC power supply 52 is electrically connected to the shower head 16 serving as the upper electrode via a low pass filter (LPF) 51. The power supply of the variable DC power supply 52 can be on-off controlled by an on/off switch 53. The current and voltage supplied from the variable DC power supply 52 and the on/off operation of the on/off switch 53 are controlled by a control unit 60 to be described later. As will be described later, when a plasma is generated in a processing space by applying to the mounting table 2 the RF powers from the first RF power supply 10a and the second RF power supply 10b, the on/off switch 53 is turned on by the control unit 60 if necessary and, thus, a predetermined DC voltage is applied to the shower head 16 serving as the upper electrode.

A cylindrical ground conductor 1a is provided to extend upward from a sidewall of the processing chamber 1 beyond higher than the shower head 16. The cylindrical ground conductor 1a has a ceiling plate at its upper portion.

A gas exhaust port 71 is formed at a bottom portion of the processing chamber 1, and a gas exhaust unit 73 is connected to the gas exhaust port 71 through a gas exhaust line 72. By operating a vacuum pump included in the gas exhaust unit 73, the processing chamber 1 can be depressurized to a predetermined vacuum level. Further, a loading/unloading port 74 through which the wafer W is transferred is provided at a sidewall of the processing chamber 1, and a gate valve 75 for opening and closing the loading/unloading port 74 is provided at the loading/unloading port 74.

Reference numerals 76 and 77 denote detachable deposition shields. The deposition shield 76 is installed along the inner wall of the processing chamber 1, and the deposition shield 77 is provided so as to surround the support 4 and the mounting table 2. The deposition shields 76 and 77 serve to prevent etching by-products (deposits) from being attached to the inner wall of the processing chamber 1 and the like.

The entire operation of the plasma etching apparatus having the above-described configuration is controlled by the control unit 60. The control unit 60 includes a process controller 61, a user interface 62, and a storage unit 63. The process controller 61 includes a CPU to control various units of the plasma etching apparatus.

The user interface 62 includes a keyboard for inputting commands, a display unit for displaying an operation status of the plasma etching apparatus to allow a process manager to manage the plasma etching apparatus, and the like.

The storage unit 63 stores therein recipes including control programs (software) for implementing various processes performed in the plasma etching apparatus under control of the process controller 61, process condition data and the like. If necessary, a certain recipe is called from the storage unit 63 in accordance with an instruction input through the user interface 62 and executed in the process controller 61. Accordingly, a desired process is performed in the plasma etching apparatus under the control of the process controller 61. Further, the recipes including control programs, process condition data and the like may be retrieved from a computer-readable storage medium (e.g., a hard disk, a CD, a flexible disk, a semiconductor memory or the like), or retrieved on-line through, e.g., a dedicated line from another available apparatus whenever necessary.

Hereinafter, a sequence for plasma-etching an insulating film and the like formed on a semiconductor wafer W by using the plasma etching apparatus configured as described above will be explained. First, the gate valve 75 opens, and the semiconductor wafer W is loaded from a load lock chamber (not shown) into the processing chamber 1 by a transfer robot (not shown) through the loading/unloading port 74 to be mounted on the mounting table 2. Then, the transfer robot is retreated outwardly from the processing chamber 1, and the gate valve 75 is closed. Thereafter, the processing chamber 1 is evacuated via the gas exhaust port 71 by the vacuum pump of the gas exhaust unit 73.

After the inside of the processing chamber 1 is evacuated to a predetermined vacuum level, a predetermined processing gas (etching gas) is supplied from the processing gas supply source 15 into the processing chamber 1. When the inside of the processing chamber 1 is maintained at a predetermined pressure of, e.g., about 4.7 Pa (35 mTorr), an RF power having a frequency of, e.g., 40 MHz, is supplied from the first RF power supply 10a to the mounting table 2. Further, an ion attraction (bias) RF power having a frequency of, e.g., 2.0 MHz, is supplied from the second RF power supply 10b to the mounting table 2. At this time, a predetermined DC voltage is applied from the DC power supply 12 to the electrode 6a of the electrostatic chuck 6, so that the semiconductor wafer W is attracted and held on the electrostatic chuck 6 by a Coulomb force.

By supplying the RF powers to the mounting table 2 as described above, an electric field is formed between the upper electrode, i.e., the shower head 16 and the lower electrode, i.e., the mounting table 2. Thus, a discharge is generated in the processing space where the semiconductor wafer W is located. As a result, a plasma of the processing gas is generated, and an insulating film and the like formed on the semiconductor wafer W are etched by the plasma of the processing gas. At this time, the on/off switch 53 is turned on if necessary to apply a predetermined DC voltage from the DC power supply 52 to the shower head 16 serving as the upper electrode. In the etching process, a cycle including a first step in which a flow rate of at least one of the processing gases is set to a first value and a second step in which the flow rate thereof is set to a second value that is different from the first value is repeated consecutively at least three times without extinguishing the plasma generated in the processing chamber 1. The first and the second step will be described in detail later.

After the above-described etching process is completed, the supply of the RF powers, the DC voltage, and the processing gas is stopped, and the semiconductor wafer W is unloaded from the processing chamber 1 in the reverse sequence to the above-described sequence.

The following description relates to a semiconductor device manufacturing method which is performed by using the plasma etching apparatus 200 configured as described above in accordance with an embodiment of the present invention. FIGS. 2A to 2F schematically show an example of a structure of a semiconductor wafer W to be patterned by plasma etching in the present embodiment.

Figure 2A:
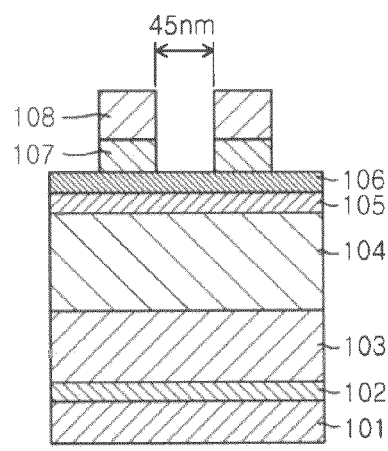
FIGS. 2A to 2F explain a semiconductor device manufacturing method in accordance with an embodiment of the present invention.

As shown in FIG. 2A, a silicon nitride film 102 (thickness of, e.g., about 20 nm), a silicon oxide film 103 (thickness of, e.g., about 500 nm), a carbon film 104 (thickness of, e.g., about 670 nm), a silicon oxide film 105 (thickness of, e.g., about 40 nm), a bottom anti-reflection coating film 106 are formed in that order from the bottom on the surface of a silicon substrate 101. Further, two photoresist films 107 and 108 patterned in a predetermined shape (in which holes having a predetermined inner diameter are formed at predetermined intervals in the present embodiment) are formed on the bottom anti-reflection coating film 106.

Figure 2B:
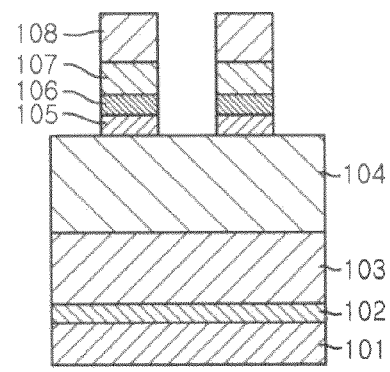
Figure 2C:
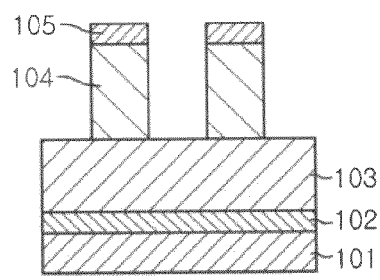

In the present embodiment, the bottom anti-reflection coating film 106 and the silicon oxide film 105 are plasma-etched from a state shown in FIG. 2A to a state shown in FIG. 2B. Next, the carbon film 104 is plasma-etched to a state shown in FIG. 2C.

Figure 2D:
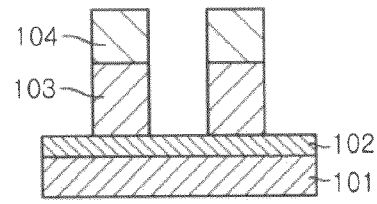
Figure 2E:
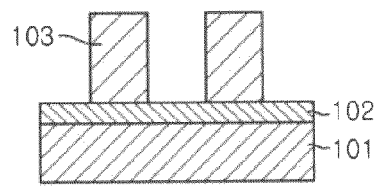
Figure 2F:
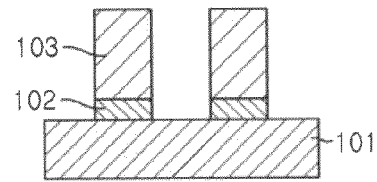

Thereafter, the silicon oxide film 103 is plasma-etched to a state shown in FIG. 2D. Then, the carbon film 104 remaining on the silicon oxide film 103 is removed by ashing to a state shown in FIG. 2E. Lastly, the silicon nitride film 102 is etched to a state shown in FIG. 2F. In this way, a plurality of hole-shaped patterns penetrating the silicon oxide film 103 having a thickness of about 500 nm and the silicon nitride film 102 having a thickness of about 20 nm is formed at a predetermined interval.

In the present embodiment, the case of plasma-etching the silicon oxide film 103 will be described. At this time, as for a processing gas, a gaseous mixture of, e.g., a fluorine compound gas, $O_2$ gas and Ar gas, is used. As for the fluorine compound gas, it is preferable to use, e.g., $C_4F_6$ gas. Moreover, in the present embodiment, a cycle including a first step in which a flow rate of $C_4F_6$ gas for facilitating etching is set to a first value and a second step in which the flow rate thereof is set to a second value that is different from the first value is repeated consecutively at least three times without extinguishing the plasma generated in the processing chamber 1.

In this regard, a first time for performing the first step and a second time for performing the second step are preferably set to range from about 1 to 15 seconds, and more preferably set from about 2.5 to 10 seconds. The reason thereof will be described later.

Moreover, the total flow rate of the processing gas in the first step and that in the second step are preferably set to be substantially equal to each other. If the total flow rates are different, it is preferable to control the difference therebetween to range within about 10% of the larger one of the total flow rates. In other words, when the total flow rate of the processing gas in the first step is, e.g., about 1000 sccm and larger than that in the second step, the total flow rate of the processing gas in the second step is set between about 900 sccm and 1000 sccm. Accordingly, the pressure in the processing chamber in the first step and that in the second step become set to be substantially equal to each other and, thus, it is possible to suppress a drastic change in the state of the plasma etching process, which is beyond the pressure variation range in which an APC (automatic pressure control) valve provided at the processing chamber is operable.

In each of the first and the second step, a gas for facilitating etching of an etching target film (silicon oxide film in the present embodiment) is contained in the processing gas. Therefore, in the present embodiment, a fluorine compound gas is contained in the processing gas in each of the first and the second step. Hence, the decrease in the etching rate can be prevented.

As a test example 1, the silicon oxide film 103 was plasma-etched by using the plasma etching apparatus shown in FIG. 1 under the following conditions.

Pressure: 4.7 Pa (35 mTorr)
RF power (H/L): 2000/4000 W
DC voltage: 150 V
Processing gas (first step): $C_4F_6/O_2/Ar$=60/65/900 sccm Processing gas (second step): $C_4F_6/O_2/Ar=80/65/900$ sccm Processing time: (10 sec in first step+10 sec in second step)×4 (total 80 sec) overetch 41%

Temperature (top/sidewall/mounting table): 150/150/60° C.

He pressure at backside of wafer (center/edge): 2000/5300 Pa (15/40 Torr)

Figure 3A:
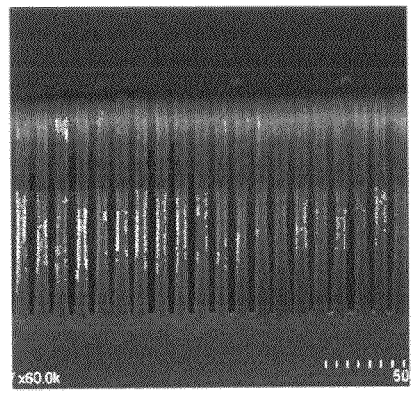
FIGS. 3A to 3C respectively provide electron microscope images of patterns of a test example 1 and comparative examples 1 and 2.

In the test example 1, a hole pattern having a desired shape (hole diameter of about 45 nm) was formed, and a selectivity of a base layer to the silicon nitride film 102 was about 40. The electron microscope image of the pattern at this time is shown in FIG. 3A.

Figure 3B:
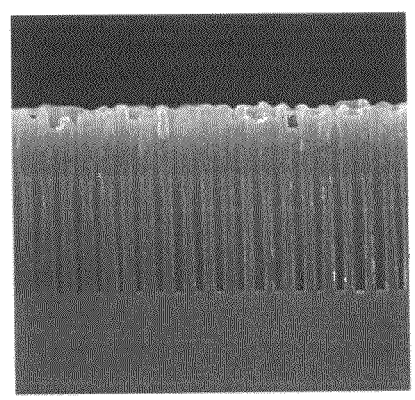
Figure 3C:
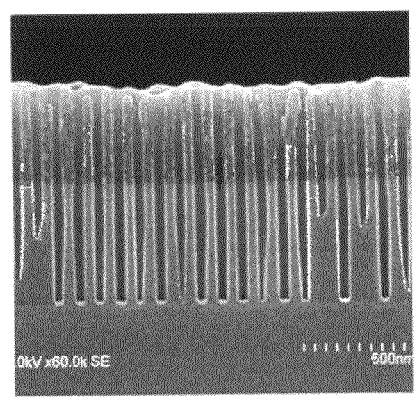

As a comparative example 1, plasma etching was performed under the same conditions as those of the test example 1 except that a flow rate of $C_4F_6$ gas was fixed to about 60 sccm without periodic changes thereof and the processing time was set to about 90 seconds (overetch 50%). As a comparative example 2, plasma etching was performed under the same conditions as those of the test example 1 except that the flow rate of $C_4F_6$ gas was fixed to about 80 sccm without periodic changes thereof and the processing time was set to about 90 second (overetch 62%). The electron microscope images of the patterns of the comparative examples 1 and 2 are shown in FIGS. 3B and 3C, respectively.

In the comparative example 1, the pattern shape was improved, whereas the selectivity of the base layer to the silicon nitride film 102 was low (about 19.1). In the comparative example 2, the selectivity of the base layer to the silicon nitride film 102 was high (about 34.9), whereas the permeability was poor and more patterns showed the etch-stop state.

As described above, in the test example 1, the shape and the selectivity of the pattern were improved compared to the case of performing plasma etching while fixing the flow rate of $C_4F_6$ gas.

Next, the in-plane uniformity of the etching rate was examined by performing plasma etching on a thermal oxide film formed on a blanket wafer in each case of the same conditions of the test example 1 (except for the processing time of about 80 seconds) (test example 1-2), under the same conditions of the comparative example 1 (except that the processing time was about 80 seconds) (comparative example 1-2), and under the same conditions of the comparative example 2 (except for the processing time of about 80 seconds) (comparative example 2-2). In addition, the examination was performed while fixing the flow rate of $C_4F_6$ gas to about 70 sccm without periodic changes thereof (processing time of about 80 seconds) (comparative example 3-2).

Figure 4:
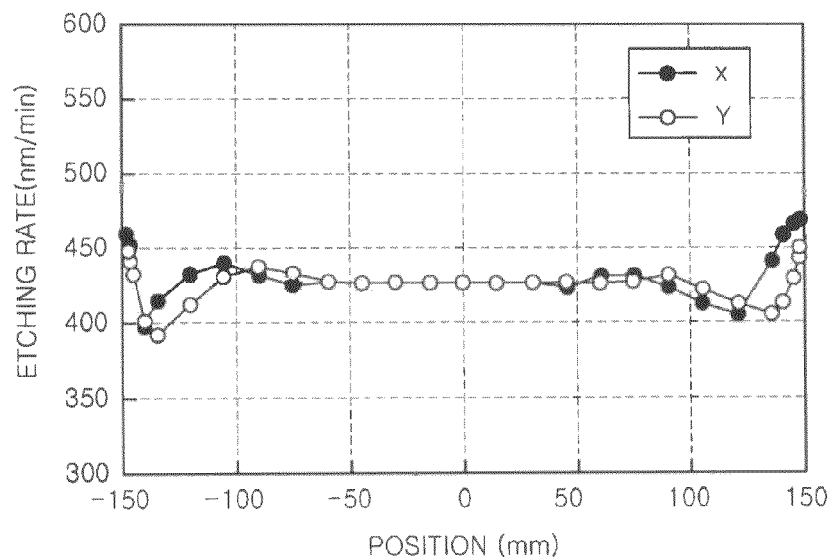
FIGS. 4 to 13 are graphs showing a result of examination on in-plane uniformity of an etching rate.

The results thereof are shown in the graphs of FIGS. 4 to 7 in which the vertical axis indicates an etching rate and the horizontal axis indicates a position in the surface of the wafer. In the graphs, notations '●' and '○' denote a value measured along the X direction and a value measured along the Y direction perpendicular to the X direction, respectively. As shown in FIG. 4, in the test example 1-2, the average etching rate was about 430.1 nm/min, and the uniformity was about 8.1%.

Figure 5:
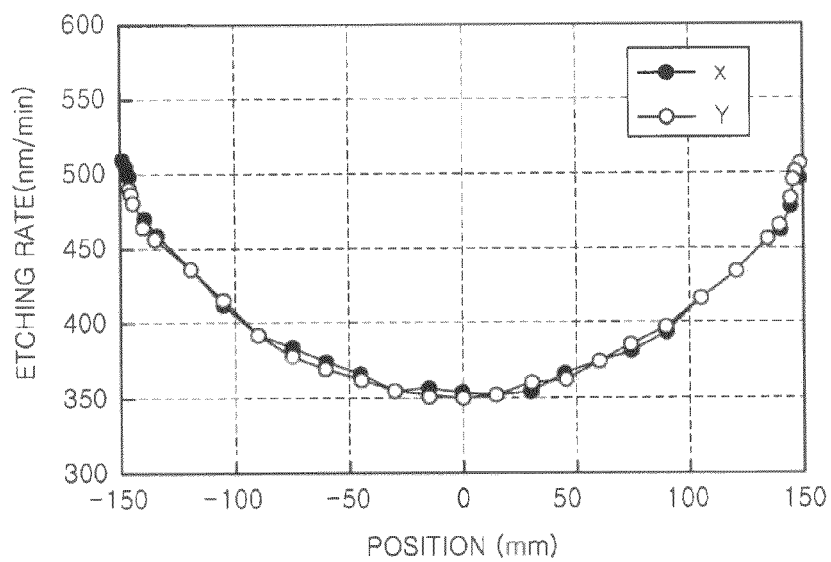
Figure 6:
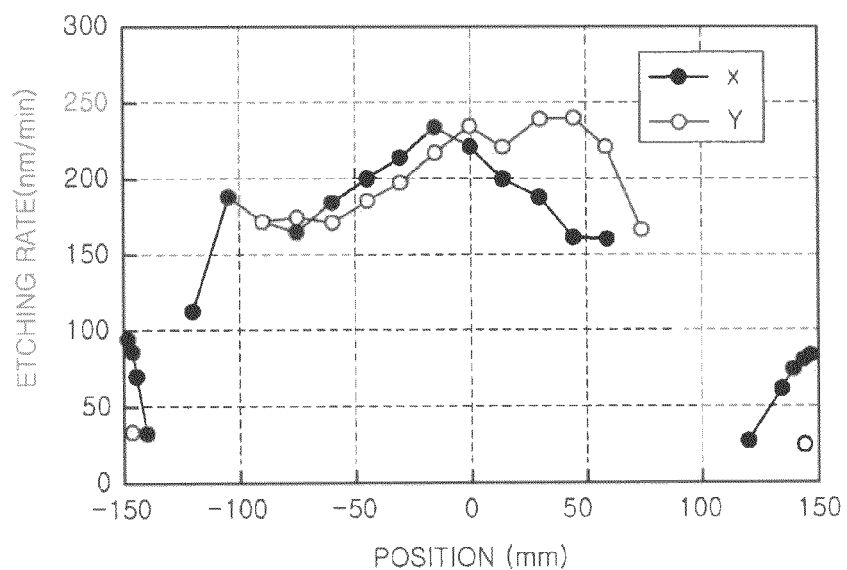
Figure 7:
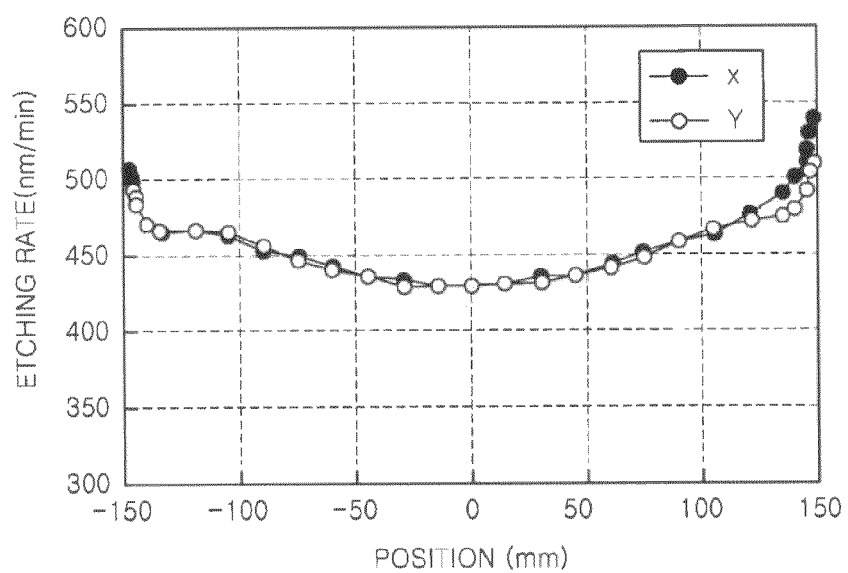

On the other hand, in the comparative example 1-2 shown in FIG. 5, the average etching rate was about 413.5 nm/min, and the uniformity was about 17.5%. Further, the tendency that the etching rate was decreased at the central portion of the wafer and increased at the peripheral portion of the wafer was noticeable. In the comparative example 2-2 shown in FIG. 6, the average etching rate was about 141.0 nm/min. However, portions in which the film thickness was not measurable due to a large amount of deposits (parts that were not plotted in FIG. 6) were observed between the peripheral portion and the central portion of the wafer. In the comparative example 3-2 shown in FIG. 7, the average etching rate was increased to about 463.3 nm/min, whereas the uniformity was decreased to about 11.6%. Moreover, the tendency that the etching rate was decreased at the central portion of the wafer and increased at the peripheral portion of the wafer was noticeable.

As set forth above, in the test example 1-2 in which the flow rate of $C_4F_6$ gas was changed periodically, the etching rate and the uniformity were improved compared to the comparative example in which the flow rate of $C_4F_6$ gas was fixed.

In the test examples 1 and 1-2, the first step and the second step were performed respectively for about 10 seconds, and four cycles of the first and the second step were changed periodically. However, the first and the second step may be performed preferably for about 1 to 15 seconds, and more preferably for about 2.5 to 10 seconds. The reason thereof will be described later.

Figure 8:
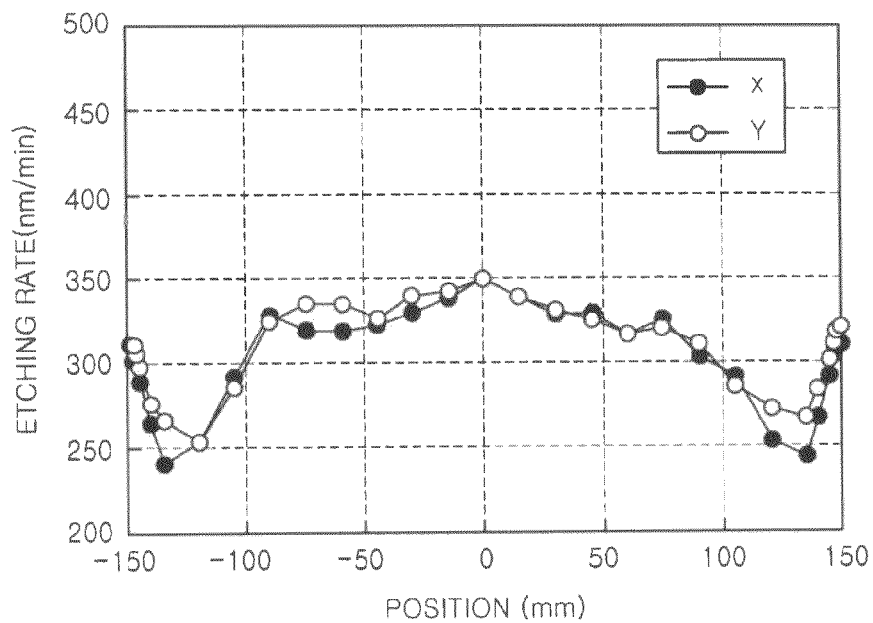
Figure 9:
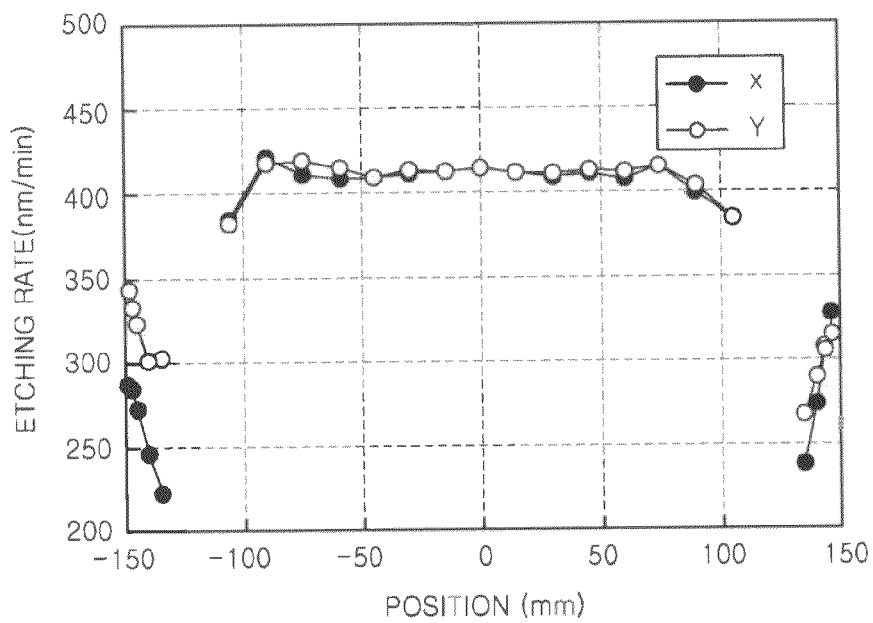
Figure 10:
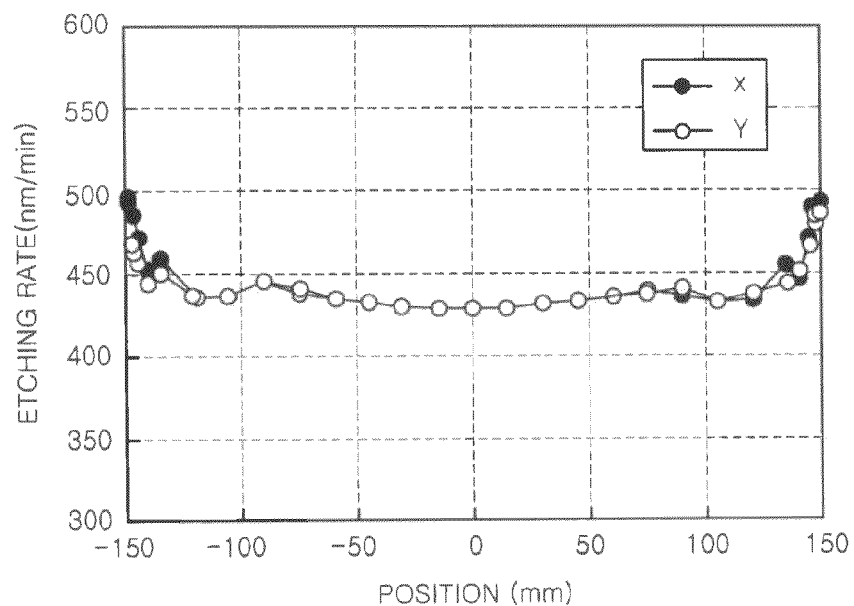
Figure 11:
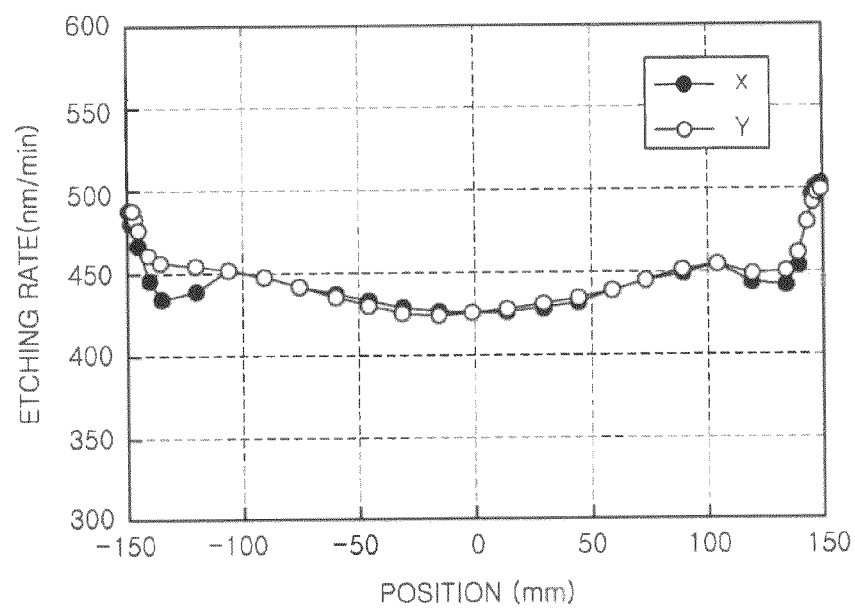
Figure 12:
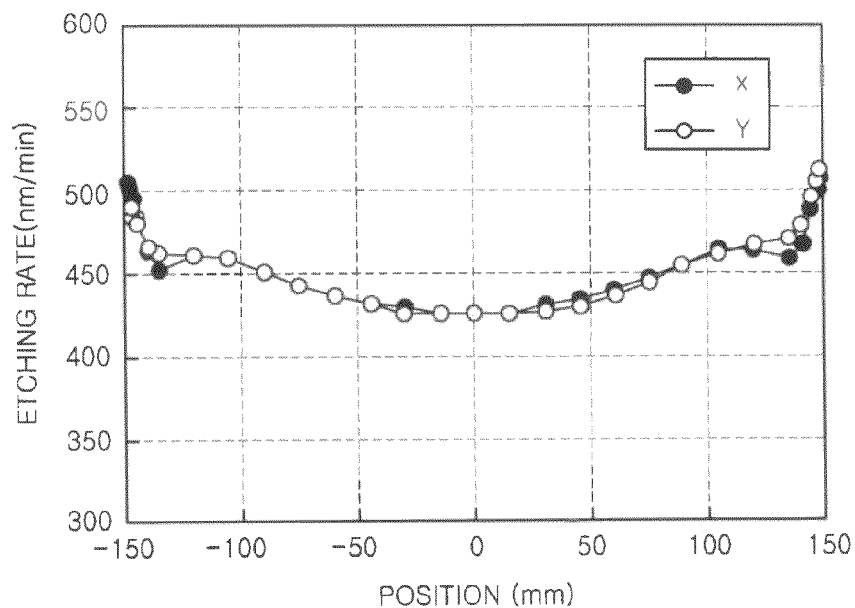
Figure 13:
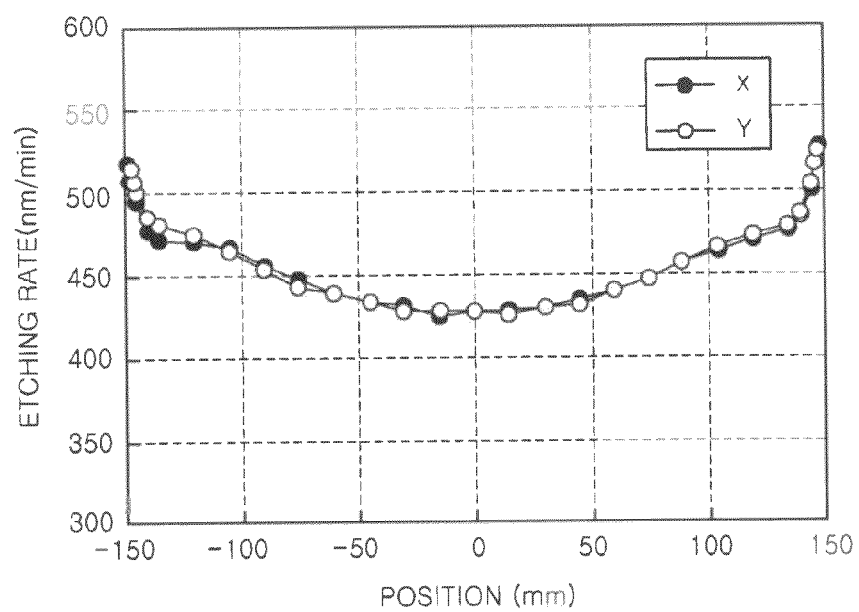

FIG. 8 shows the result of examination on the etching rate and the in-plane uniformity in the case of performing one cycle of the first and the second step for about 40 seconds in the test example 1-2. FIG. 9 shows the result obtained by performing two cycles of the first and the second step for about 20 seconds per each step. FIG. 10 shows the result obtained by performing 8 cycles of the first and the second step for about 5 seconds per each step. FIG. 11 shows the result obtained by performing 16 cycles of the first and the second step for about 2.5 seconds per each step. FIG. 12 shows the result obtained by performing 40 cycles of the first and the second step for about 1 second per each step. FIG. 13 shows the result obtained by performing 80 cycles of the first and the second step for about 0.5 second per each step.

As shown in FIG. 13, when the first and the second step respectively were performed for about 0.5 second, the result substantially the same as that obtained in the case of continuously supplying $C_4F_6$ gas at the flow rate of about 70 sccm (comparative example 3-2 (FIG. 7)) was obtained, and the uniformity of the etching rate was hardly improved. In this case, the average etching rate was about 461.7 nm/min, and the uniformity was about 10.6%.

As illustrated in FIG. 12, when the first and the second step were respectively performed for about 1 second, the uniformity of the etching rate was improved compared to the case of continuously supplying $C_4F_6$ gas at the flow rate of about 70 sccm (comparative example 3-2 (FIG. 7)). In this case, the average etching rate was about 454.5 nm/min, and the uniformity was about 9.1%.

As shown in FIG. 11, when the first and the second step were respectively performed for about 2.5 seconds (the average etching rate of about 446.8 nm/min, the uniformity of about 8.6%) and when the first and the second step were respectively performed for about 5 seconds as shown in FIG. 10 (the average etching rate of about 447.3 nm/min, the uniformity of about 7.2%), the improvement of the uniformity of the etching rate was gradually increased.

However, when the first and the second step were respectively performed for a longer period of time, e.g., about 20 seconds, compared to the test example 1-2 in which the first and the second step were respectively performed for about 10 seconds, the etching rate and the uniformity were decreased compared to the case of continuously supplying $C_4F_6$ gas at the flow rate of about 70 sccm (comparative example 3-2 (FIG. 7)), as shown in FIG. 9. In this case, the average etching rate was about 364.7 nm/min, and the uniformity was about 27.2%. In FIG. 9, parts that are not plotted indicate portions in which the film thickness was not measurable due to a large amount of deposits.

Even when the first and the second step were respectively performed for about 40 seconds as shown in FIG. 8, the etching rate and the uniformity were decreased compared to the case of continuously supplying $C_4F_6$ gas at the flow rate of about 70 sccm (comparative example 3-2 (FIG. 7)).

The above result shows that the time for performing the first and the second step may be set preferably to range from about 1 to 15 seconds, and more preferably from about 2.5 to 10 seconds. The reason that the desired result is obtained by setting the processing time of the first and the second step as described above is considered because a transition state in which the plasma state changes slightly occurs during the plasma etching.

Figure 14B:
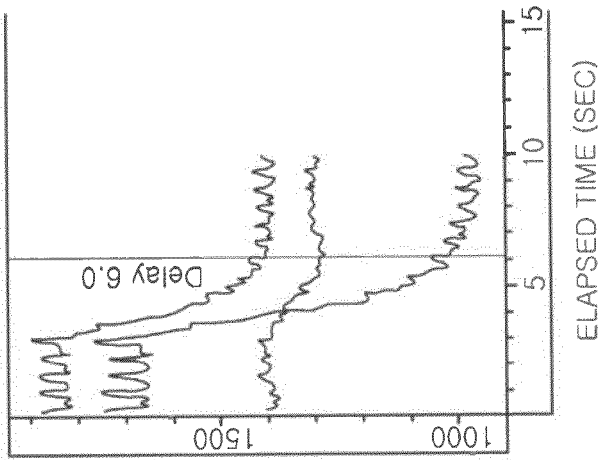
Figure 14A:
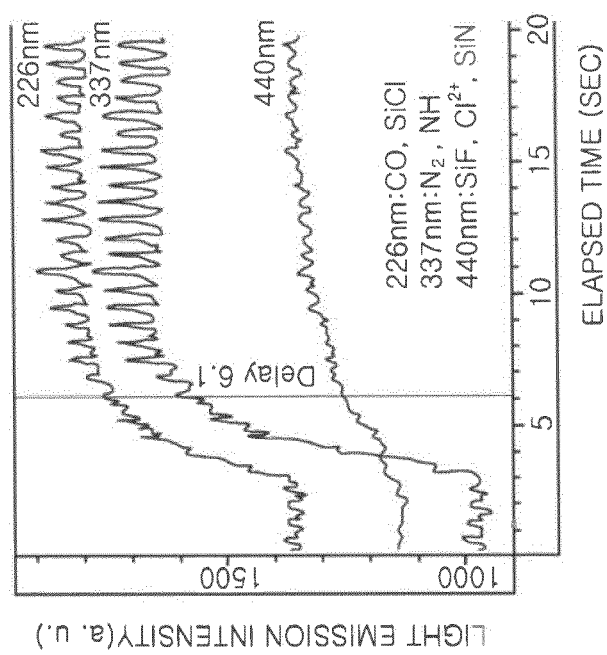

FIGS. 14A and 14B show results of examinations on temporal variations of the plasma state in the case of changing the gas flow rates. Here, the horizontal axis and the vertical axis represent elapsed time and light emission intensity, respectively. At this time, the plasma was generated under the following conditions.

Pressure: 4.0 Pa (30 mTorr)
RF power (H/L): 500/150 W
Processing gas (first step): $HBr/Cl_2/NF_3$=160/20/20 sccm
Processing gas (second step): $HBr/Cl_2/NF_3$=140/20/40 sccm The curved lines in FIGS. 14A and 14B indicate, from the top, the light emission intensities of CO and SiCl having a wavelength of about 226 nm, $N_2$ and NH having a wavelength of about 337 nm, and SiF, $Cl^{2+}$ and SiN having a wavelength of about 440 nm. As can be seen from FIG. 14A, when the first step was changed to the second step by operating a valve provided outside the processing chamber (by increasing the flow rate of $NF_3$ and decreasing the flow rate of HBr), the plasma state started to change after about 3 seconds and became stable after about 10 seconds. In other words, in that case, the transition state occurred for about 7 seconds.

Further, when the second step was changed to the first step (by decreasing the flow rate of $NF_3$ and increasing the flow rate of HBr), the plasma state started to change after about 3 seconds and became stable after about 7 seconds, as can be seen from FIG. 14B. In other words, the state became stable in the shorter period of time compared to the case shown in FIG. 14A. The volume of the processing chamber was about 68 liters.

In the case where the first step is changed to the second step and the transition state is generated for about 7 seconds, if each of the first and the second step is performed for a short period of time of about 5 seconds or less, the transition state is generated for most of the processing time, whereas the plasma state may not reach a steady state. If the first and the second step are performed for about 8 seconds, the transition state is generated for most of the processing time, and the plasma state can be changed to a substantially steady state. Thus, it is considered that the above-described effects are obtained by performing each of the first and the second step for about 8 seconds between about 1 to 15 seconds.

FIG. 15 shows the result of measuring the plasma emission intensity in the case of setting the plasma generating conditions as follows.

Figure 17:
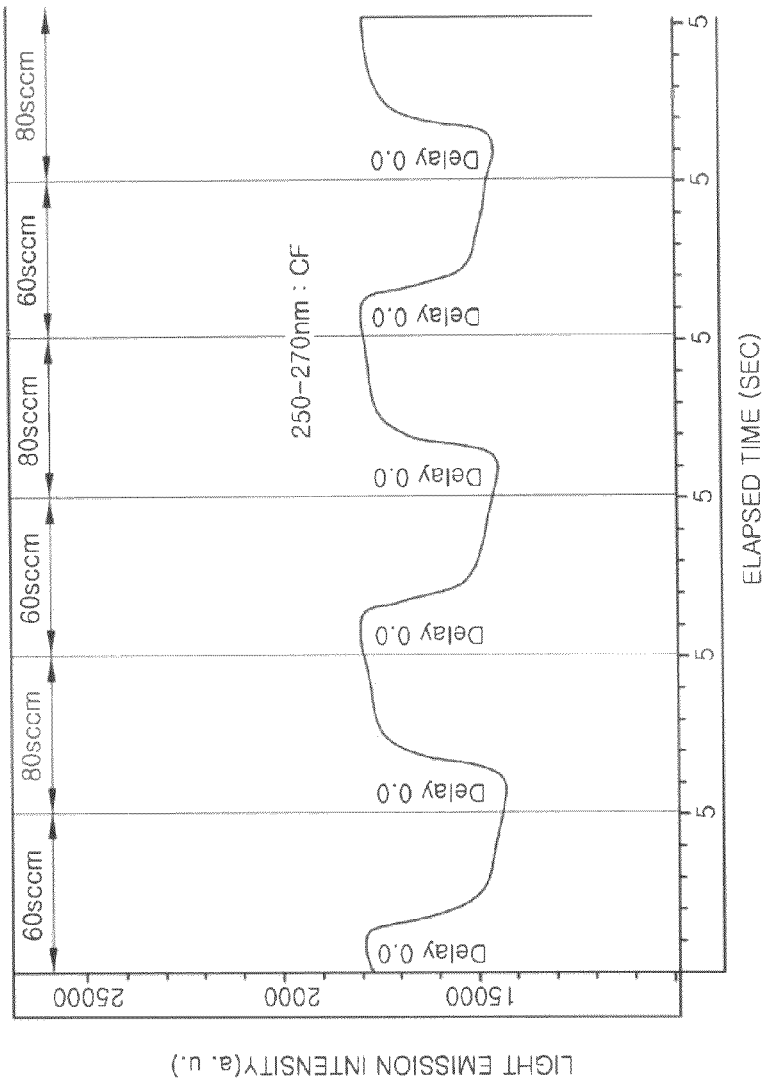
Figure 18:
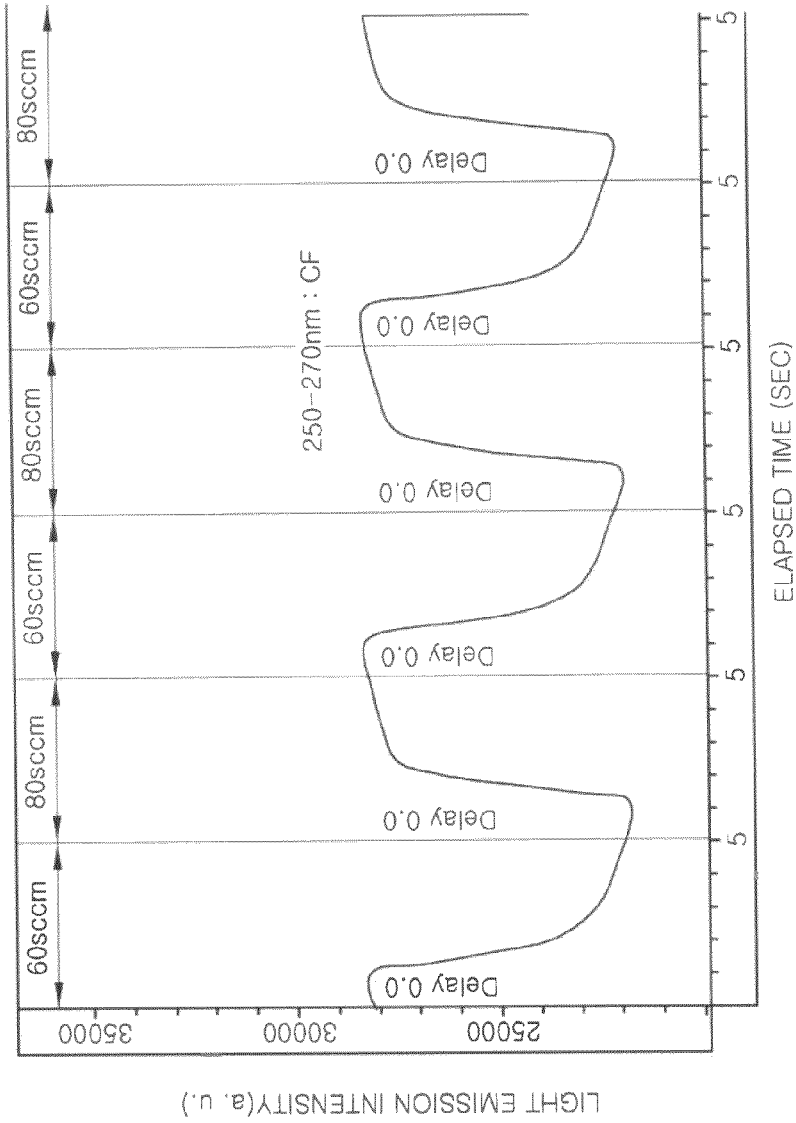

Pressure: 4.7 Pa (35 mTorr)
RF power (H/L): 2000/4000 W
Processing gas (first step (10 sec)): $C_4F_6/O_2/Ar$=60/65/200 sccm
Processing gas (second step (10 sec)): $C_4F_6/O_2/Ar$=80/65/200 sccm Here, the emission intensity of CF having a wavelength of about 250 to 270 nm is shown in FIG. 15. FIG. 16 shows the light emission intensity measured in the case of setting the time for performing each of the first and the second step to about 5 seconds under the above-described conditions; FIG. 17 shows the light emission intensity measured in the case of increasing the flow rate of Ar gas to about 900 sccm; and FIG. 18 shows the light emission intensity measured in the case of increasing the pressure to about 9.4 Pa (70 mTorr). Moreover, the volume of the processing chamber was about 68 liters.

As can be seen from FIGS. 15 to 18, the variation range of the light emission intensity is decreased by increasing the flow rate of Ar gas and is increased by increasing the pressure. However, the temporal length of the transition state is hardly affected.

Figure 19:
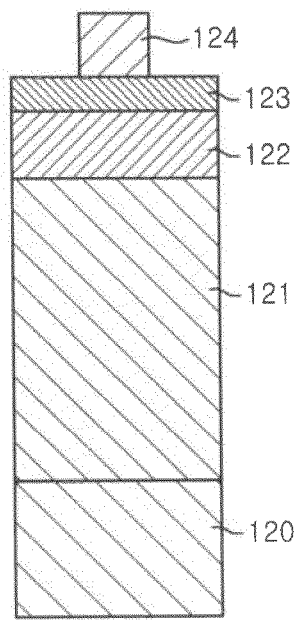
FIG. 19 shows a structure of a semiconductor wafer in accordance with a test example 2.

Hereinafter, a test example 2 will be described. In the test example 2, a line-and-space pattern was formed by plasma-etching a carbon film having a thickness of about 600 nm. In a semiconductor wafer used in the test example 2, as shown in FIG. 19, a carbon film 121 having a thickness of about 600 nm was formed on a thermal oxide film 120 having a thickness of about 1 µm, and a silicon oxide film ($SiO_2$ film) 122 having a thickness of about 60 nm and a bottom anti-reflection coating film 123 having a thickness of about 30 nm were formed thereon.

Then, a photoresist 124 having a thickness of about 100 nm and patterned in a predetermined shape was formed on the bottom anti-reflection coating film 123. In the test example 2, the bottom anti-reflection coating film 123 and the silicon oxide film 122 were etched by using the photoresist 124 as a mask and, then, the carbon film 121 was plasma-etched while using the silicon oxide film 122 as a mask.

The carbon film 121 was plasma-etched under the following conditions.

Pressure: 0.67 Pa (5 mTorr)
RF power (H/L): 500/500 W
Processing gas (first step): $HBr/O_2$=40/40 sccm
Processing gas (second step): $HBr/O_2$=0/80 sccm
Processing time: (11 sec in first step+11 sec in second step)×4 (total 88 seconds)
Temperature (top/sidewall/mounting table): 100/80/40° C.
He pressure at backside of wafer (center/edge): 1330/1330 Pa (10/10 Torr)

Figure 20A:
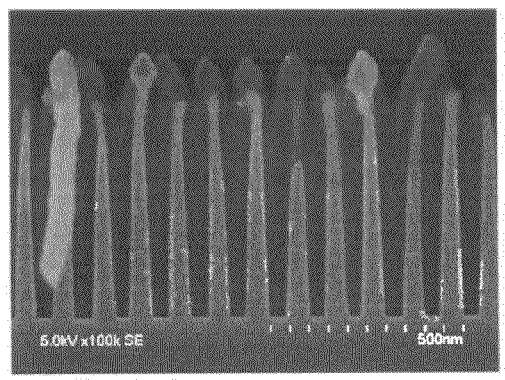
FIGS. 20A to 20C respectively provide electron microscope images of patterns of the test example 2 and comparative examples 3 and 4.

In the test example 2, a line-and-space pattern having a predetermined shape was formed by plasma-etching the carbon film 121 having a thickness of about 600 nm while ensuring the selectivity to the silicon oxide film 122 serving as a mask layer. The electron microscope image of the pattern of the test example 2 is shown in FIG. 20A.

Figure 20B:
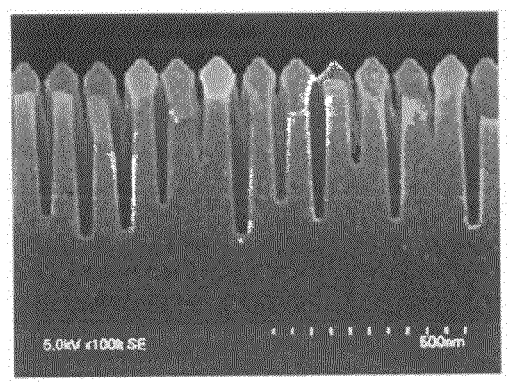

As a comparative example 4, the same plasma etching was performed under the same conditions as the test example 2 except that the flow rate of the processing gas of $HBr/O_2$ was fixed to about 40/40 sccm. As a result, the etching was stopped in the middle of the processing and was not completed. The electron microscope image of the pattern of the comparative example 4 is shown in FIG. 20B.

Figure 20C:
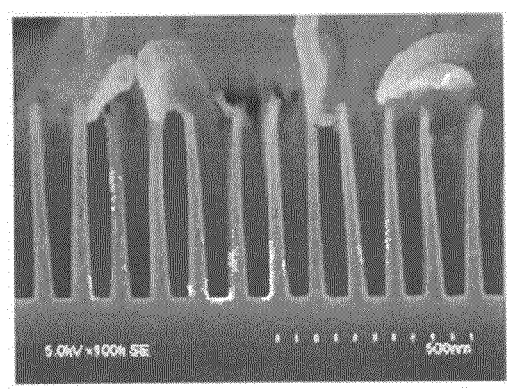

As a comparative example 5, the same plasma etching was performed under the same conditions as the test example 2 except that the flow rate of the processing gas of $O_2$ was fixed to about 80 sccm. As a result, the state of the mask was not maintained due to the insufficient selectivity to the silicon oxide film 122 serving as a mask layer, and a critical dimension (CD) of the carbon film 121 was reduced. The electron microscope image of the pattern of the comparative example 5 is shown in FIG. 20C.

Figure 21:
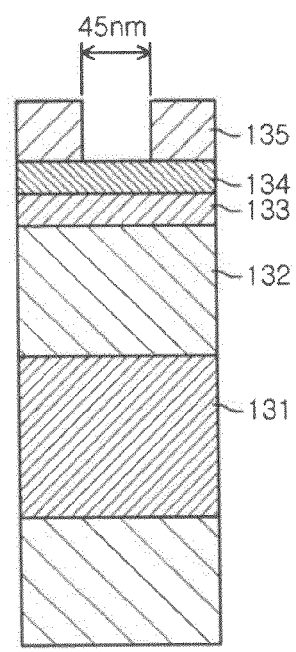
FIG. 21 shows a structure of a semiconductor wafer in accordance with a test example 3.

Hereinafter, a test example 3 will be described. A hole pattern was formed on an amorphous silicon film having a thickness of about 400 nm positioned under a carbon film having a thickness of about 300 nm. In a semiconductor wafer used in the test example 3, as shown in FIG. 21, a carbon film 132 having a thickness of about 300 nm was formed on an amorphous silicon film 131 having a thickness of about 400 nm, and a silicon oxide (SiO$_2$) film 133 having a thickness of about 60 nm and a bottom anti-reflection coating film 134 were formed thereon.

Then, a photoresist 135 having a thickness of about 100 nm and patterned in a predetermined shape was formed on the bottom anti-reflection coating film 134. In the test example 3, the bottom anti-reflection coating film 134 and the silicon oxide film 133 were etched while using the photoresist 135 as a mask and, then, the carbon film 132 was etched while using the silicon oxide film 133 as a mask. Thereafter, the amorphous silicon film 131 was plasma-etched.

The amorphous silicon film 131 was plasma-etched under the following conditions.

Pressure: 16.0 Pa (120 mTorr)
RF power (H/L): 2500/1300 W
Processing gas (first step): NF$_3$/HBr/O$_2$=0/300/20 sccm
Processing gas (second step): NF$_3$/HBr/O$_2$=5/300/20 sccm
Processing time: (10 sec in first step+10 sec in second step)×3 (total 60 sec)
Temperature (top/sidewall/mounting table): 100/80/80° C.
He pressure at backside of wafer (center/edge): 1330/1330 Pa (10/10 Torr)

Figure 22:
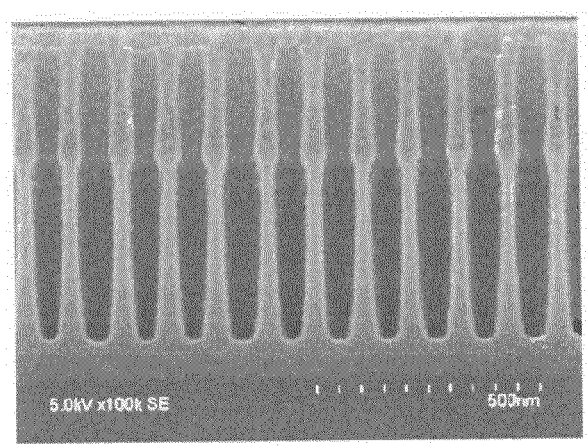
FIG. 22 provides an electron microscope image of a pattern of the test example 3.

In the test example 3, a hole pattern having a predetermined shape was formed by plasma-etching the amorphous silicon film 131 having the thickness of about 400 nm. The electron microscope image of the pattern of the test example 3 is shown in FIG. 22.

In accordance with the present embodiment, it is possible to provide a semiconductor device manufacturing method and a plasma etching apparatus, capable of uniformly forming a fine pattern with high accuracy and high selectivity.

While the invention has been shown and described with respect to the embodiments, it will be understood by those skilled in the art that various changes and modification may be made without departing from the scope of the invention as defined in the following claims.

What is claimed is:

1. A semiconductor device manufacturing method comprising:
   a plasma etching step for etching a single etching target film formed on a substrate accommodated in a processing chamber, wherein the processing chamber includes a pressure control valve,
   wherein in the plasma etching step, a processing gas including a gaseous mixture containing a plurality of predetermined gases is supplied into the processing chamber, and wherein said plasma etching step includes a cycle, wherein said cycle is repeated consecutively at least three times without extinguishing a plasma generated in the processing chamber, and further wherein said cycle includes a first step in which a flow rate of at least one of the predetermined gases is set to a first value during a first time period, and said cycle further includes a second step in which the flow rate of said at least one of the predetermined gases is set to a second value that is different from the first value during a second time period;
   wherein the first time period and the second time period are each set to range from about 1 to 15 seconds;
   wherein a total flow rate of the plurality of predetermined gases in the first step and a total flow rate of the plurality of predetermined gases in the second step are set to be substantially equal to each other, or a difference between the total flow rates, if there exists, is set to range within about 10% of the larger one of the total flow rates so that a pressure variation between the first step and the second step is in a range in which the pressure control valve provided in the processing chamber is operable; and
   wherein a gas for facilitating etching of the single etching target film is contained in the processing gas in each of the first and the second step.

2. The method of claim 1, wherein the first time period and the second time period are each set to range from about 2.5 to 10 seconds.

3. The method of claim 1, wherein the first time period and the second time period are set to be equal to each other.

4. The method of claim 1, wherein the single etching target film is a silicon oxide film;
   wherein the processing gas contains at least a fluorine compound gas; and
   wherein a flow rate of the fluorine compound gas is set to the first value in the first step and to the second value in the second step.

5. The method of claim 4, wherein the fluorine compound gas is C$_4$F$_6$ gas.

6. The method of claim 4, wherein the processing gas contains O$_2$ gas and Ar gas.

7. The method of claim 1, wherein the single etching target film is an amorphous silicon film; the processing gas contains at least NF$_3$ gas, HBr gas and O$_2$ gas; and
   wherein a flow rate of NF$_3$ gas is set to the first value in the first step and to the second value in the second step.

8. The method of claim 1, wherein the single etching target film is a carbon film;
   wherein the processing gas contains at least HBr gas and O$_2$ gas; and
   wherein flow rates of HBr gas and O$_2$ gas are set to the first value in the first step and to the second value in the second step.

* * * * *